United States Patent
Saito et al.

[11] Patent Number: 5,914,964
[45] Date of Patent: Jun. 22, 1999

[54] MEMORY FAIL ANALYSIS DEVICE IN SEMICONDUCTOR MEMORY TEST SYSTEM

[75] Inventors: Takashi Saito; Hiromi Oshima, both of Saitama, Japan

[73] Assignee: Advantest Corp., Tokyo, Japan

[21] Appl. No.: 08/765,048

[22] PCT Filed: Jul. 19, 1996

[86] PCT No.: PCT/JP96/02016

§ 371 Date: May 9, 1997

§ 102(e) Date: May 9, 1997

[87] PCT Pub. No.: WO97/04328

PCT Pub. Date: Feb. 6, 1997

[30] Foreign Application Priority Data

Jul. 19, 1995 [JP] Japan ................................. 7-205342

[51] Int. Cl.$^6$ ............................. G06F 11/00; G11C 29/00
[52] U.S. Cl. ................................... 371/5.1; 371/21.1
[58] Field of Search .................................. 371/5.1, 21.1, 371/21.6; 395/183.18, 185.07; 364/246, 246.3

[56] References Cited

U.S. PATENT DOCUMENTS

5,117,393  5/1992  Miyazawa et al. ................. 365/201
5,228,000  7/1993  Yamagata ............................ 365/201

FOREIGN PATENT DOCUMENTS

61-271700  12/1986  Japan.

OTHER PUBLICATIONS

"Computer System Architecture", M. Morris Mano, $2^{nd}$ Edition, Prentice–Hall, Inc.; Englewood Cliffs N.J. 1982; pp. 75–80, 1982.

Digital Technical Study, Digital Circuit, Kabushiki Kaisha Corona, Mar. 20, 1991, No. 30, pp. 38–39 and 81–82. (Japanese Language Only).

"Computer System Architecture", M. Morris Mano, $2^{nd}$ Edition, Prentice–Hall, Inc.; Englewood Cliffs N.J., 1982; pp. 113–116 & 163–165, 1982.

*Primary Examiner*—Trinh L. Tu
*Attorney, Agent, or Firm*—Muramatsu & Associates

[57] ABSTRACT

A memory fail analysis device for a semiconductor test system is attained in which fail data of a plurality of bits is read out in parallel to count the overall fail bits in a short period of time. In a fail bit counting device in a fail memory for the semiconductor memory test system, a fail memory block 358 is provided which is recognized as a single memory when measuring the MUT while divided into M blocks to read the stored data in M bits parallel at the same time when counting the number of fail bits. Further, a fail counter 360 is provided which receives the M bit data and encodes the number of either high or low logic levels in the data into binary code data and counts the binary code data to accumulate the counted number.

4 Claims, 6 Drawing Sheets

FIG.3

Logic Table

| Input | | | | Output | | |
|---|---|---|---|---|---|---|
| n3 | n2 | n1 | n0 | x2 | x1 | x0 |
| 0 | 0 | 0 | 0 | 0 | 0 | 0 |
| 0 | 0 | 0 | 1 | 0 | 0 | 1 |
| 0 | 0 | 1 | 0 | 0 | 0 | 1 |
| 0 | 0 | 1 | 1 | 0 | 1 | 0 |
| 0 | 1 | 0 | 0 | 0 | 0 | 1 |
| 0 | 1 | 0 | 1 | 0 | 1 | 0 |
| 0 | 1 | 1 | 0 | 0 | 1 | 0 |
| 0 | 1 | 1 | 1 | 0 | 1 | 1 |
| 1 | 0 | 0 | 0 | 0 | 0 | 1 |
| 1 | 0 | 0 | 1 | 0 | 1 | 0 |
| 1 | 0 | 1 | 0 | 0 | 1 | 0 |
| 1 | 0 | 1 | 1 | 0 | 1 | 1 |
| 1 | 1 | 0 | 0 | 0 | 1 | 0 |
| 1 | 1 | 0 | 1 | 0 | 1 | 1 |
| 1 | 1 | 1 | 0 | 0 | 1 | 1 |
| 1 | 1 | 1 | 1 | 1 | 0 | 0 |

⊠ : Fail Cell

MEMORY FAIL ANALYSIS DEVICE IN SEMICONDUCTOR MEMORY TEST SYSTEM

TECHNICAL FIELD

This invention relates to a fail bit counting device to be used for fail bit analysis of a memory device under test (hereinafter "MUT") in a semiconductor memory test system.

BACKGROUND ART

In a memory device having a redundancy and repair capability, an inner circuit for column and low addresses includes, in addition to X and Y address lines, one or more address lines in each of the X and Y address directions for the purpose of repair. These additional address lines are used for being replaced with defective address lines through a laser trimming process whereby improving yield of the memory devices.

A semiconductor test system performs various types of operational margin tests such as a supply voltage margin test or an access time test. It is an important test item for counting the number of fail bits of the MUT under these tests. For example, in testing a semiconductor wafer, wafer production steps may vary depending on the number of fail bits. If the number of fail bits is greater than the predetermined amount, it is determined that the device is defective and the production process is terminated since it is not repairable. If the number of fail bits is smaller than the predetermined amount, the device is considered to be repairable. Thus, a fail counter is employed in the test system to count the overall fail bits of the MUT.

FIG. 4 shows a basic configuration of such a memory test system.

During the test, output signals from a plurality of MUTs are compared with expected data from a PDS (programmable data selector) 60 by a DC (digital comparator) 75, and the resultant pass/fail information $77_{fail}$ is stored in an AFM (address fail memory) 200 in an FM (fail analysis memory) 90. After the test, the AFM 200 reads out the stored information for carrying out the fail analysis.

In the AFM 200, as shown in FIG. 5, it is structured to have a plurality of channels Q in parallel to count the overall fail bits for corresponding MUTs.

Each AFM 200 includes a controller 210, an address pointer 220, an MUX (multiplexer) 230, an MUX 240, a fail memory 250, and a fail counter 260.

The fail memory 250 has a storage memory having at least the same address capacity as that of the MUT. The fail memory 250 is used, firstly, during the memory test process, to store therein the Pass/Fail data which is resulted from comparing the outputs of the MUT with the expected data by the DC 75. Address signals from a PG (pattern generator) 50 is used as the address information for this process.

Secondly, in the fail analysis process, the data in the fail memory 250 is read out to count the overall number of fail bits. In this situation, by switching the MUX 230, the address information for reading the data in the fail memory 250 is provided from the controller 210 through the address pointer 220. All of the addresses are sequentially generated and the fail bits are counted by the counter 260. In this example, the fail counter 260 is a type of counter which counts up when the fail data is "1".

The controller 210, in receiving fail analysis parameters from a CPU, controls the address generation sequence for counting the number of the fail bits. The address pointer 220 generates address signals to be supplied to the fail memory 250. The address pointer 220 generates the address signal by counting up for a desired bit area in an N bit address signal and provides the generated address signal to the MUX 230.

The MUX 230 is a selector which, in receiving a select signal from the controller 210, outputs the address signals from the PG 50 during the measurement while outputs the address signals from the address pointer 220 during the fail analysis.

The MUX 240 is a selector to select address signals $242_{adr}$ to be supplied to the fail memory 250 in a manner that the fail memory 250 has the same address space as that of the MUT. For example, the MUX 240 provides the address signal in which unused upper addresses are set to zero.

The foregoing is the explanation of the basic structure of the AFM 200. The counting operation in the AFM 200 is explained in the following with reference to the drawings.

FIG. 6 shows an example of data stored in the fail memory 250 when the number of address bits of the MUT is eight, and the X and Y addresses are provided to the fail memory 250 in which the X address is 4 bits and the Y address is 4 bits.

In the example of FIG. 6, to count all of the fail data, the address (X, Y) is sequentially incremented from (0, 0) to (F, F) to access all of 256 addresses while counting the number of fail data. In this example, the counted number is "18". Because it is necessary to apply all of the addresses to the fail memory and read the fail data therefrom, it takes a long time for counting the number which is proportional to the capacity of the memory. Thus, it requires a long time for counting the fails in a large scale memory device.

As noted above, to count all of the fail data, it is necessary to apply all of the addresses to the fail memory and read the fail data therefrom for counting up the fail data. Thus, it takes a time for counting the fails in proportion to the capacity of the memory device, which adversely affects a test throughput in the device testing for large capacity memories such as 64M bit or 250M bit memory devices.

Therefore, it is an object of the present invention to provide counting means which is capable of reducing the time for counting the number of fail bits by reading out the data from the fail memory in a plural bit form at the same time and counting the fail bits in parallel at the same time.

SUMMARY OF THE INVENTION

In a fail bit counting device for a fail memory to be used for a semiconductor memory test system, it is provided a fail memory block 358 which is recognized as a single memory when measuring the MUT while being divided into M blocks to read the stored data in M bits parallel at the same time when counting the number of fail bits. Further, a fail counter 360 is provided which receives the M bit data and encodes the number of either high logic or low logic in the data into binary code data and counts the binary code data to accumulate the counted number.

In this arrangement, a memory fail analysis device for a semiconductor test system is attained in which fail data of a plurality of bits is read out in parallel to count the overall fail bits in a short period of time.

The fail counter 360 includes an encoder 362 which converts the number of either high logic or low logic levels in the data received from the M blocks of the fail memory block 358 to binary code data, a count register 366 which latches the accumulated data, and an accumulator 364 which accumulates the encoded data from the encoder 362 and the data from the count register 366.

BRIEF DESCRIPTION OF THE DRAWINGS

FIG. 3 shows a logic data code conversion table for an encoder of the present invention which converts the received data to binary codes.

BEST MODE FOR CARRYING OUT THE INVENTION

Figure 6:
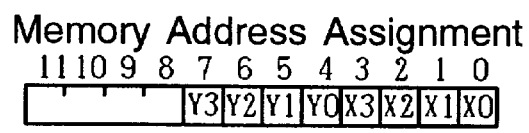
FIG. 6 is a diagram showing an example of data stored in a fail memory for explaining the fail counts in the conventional technology where the number of address bit is eight.
Figure 6:
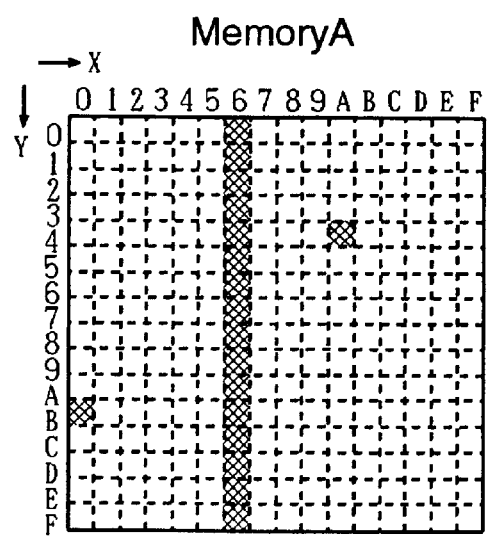

An embodiment of the present invention is explained with an example for dividing a fail analysis memory into 4 memory blocks and reading the stored data by 4 bits at the same time for counting the number of fail bits. The address data in this example is formed with 8 bits as in the conventional example of FIG. 6.

In the present invention, in testing the MUT, the fail information is stored in a fail memory block 358 as a single memory in a manner similar to the conventional technology. In the fail analysis process, however, the fail data is read out in 4 bit parallel at the same time for counting the number of fail bits.

Figure 1:
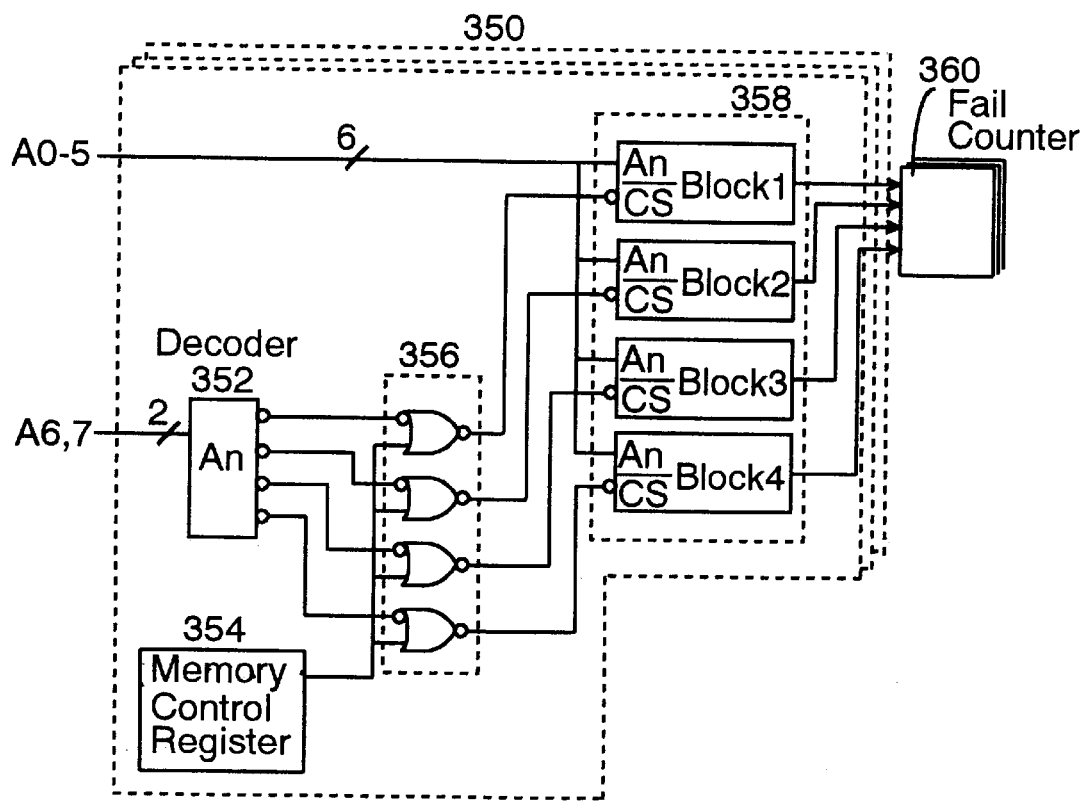
FIG. 1 is a block diagram showing structures of a fail memory 350 and a fail counter 360 of the present invention in which the number of overall fail bits is counted in a 4 bit parallel manner.

FIG. 1 shows a circuit arrangement of fail counting means corresponding to one channel of the memory test system in accordance with the present invention. This circuit arrangement is formed of a fail memory and a fail counter for counting the overall fail bits in a manner of 4 bit parallel.

Figure 8:
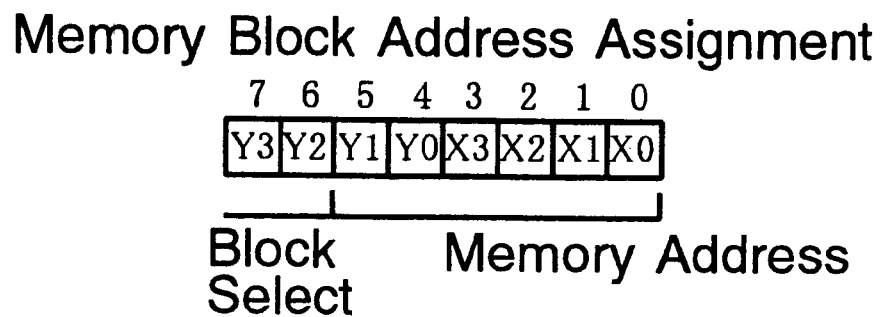
FIG. 8 is an example of bit assignment for selecting the memory blocks in the present invention.

FIG. 8 shows an example of assigning bits for selecting blocks in the fail memory.

As shown in FIG. 1, the fail memory 350 is formed of a decoder 352, an OR gate 356 and a fail memory block 358.

Figure 7:
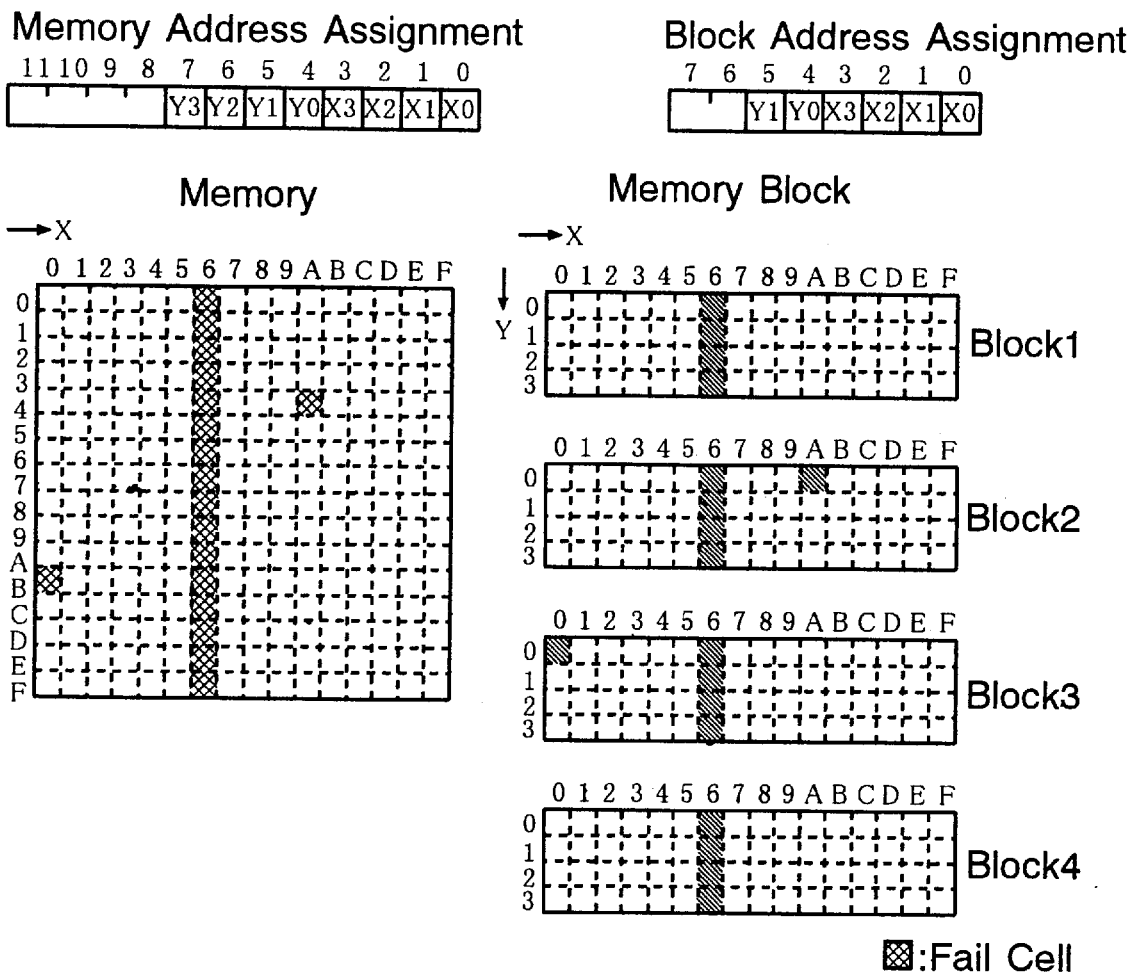
FIG. 7 is a diagram showing the data in a single memory space for writing the data therein in comparison with the data divided into four memory blocks for reading the data in accordance with the present invention.

The fail memory block 358 has a structure in which the fail memory is divided into four memory blocks. First, in the measurement of the MUT, a memory control register 354 is set to "0" so that each of enable terminals CE of the memory blocks will not be set to an enable state. Under this situation, upper address bits A6 and A7 are provided to the decoder 352. One of the terminals CE of the memory blocks is enabled by one of the four outputs of the decoder 352. Thus, the data writing operation is carried out for a single memory as in the conventional technology. FIG. 7 shows a memory address space in this situation. In FIG. 7, Y addresses 0–3 are assigned to a memory block 1, Y addresses 4–7 are assigned to a memory block 2, Y addresses 8-B are assigned to a memory block 3, and Y addresses C–F are assigned to a memory block 4, respectively.

Second, in the memory fail analysis process, the memory control register 354 is set to "1". Each of the outputs of the register is provided to the corresponding OR gate 356, which sets all of the enable terminals CE of the memory blocks to the enable state. As a result, the four memory blocks are readable in parallel at the same time. Under this situation, lower bit addresses A0–A5 are sequentially provided to the memory blocks to read the data in the corresponding addresses.

Figure 2:
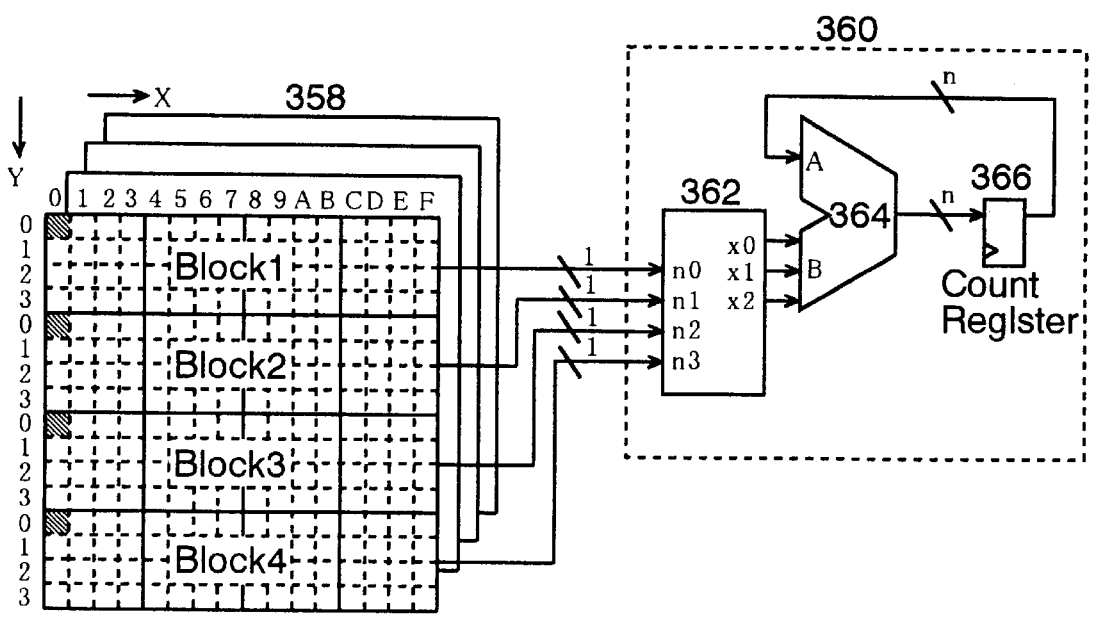
FIG. 2 is a block diagram showing a fail counter 360 of the present invention corresponding to one channel of the memory test system.
Figure 4:
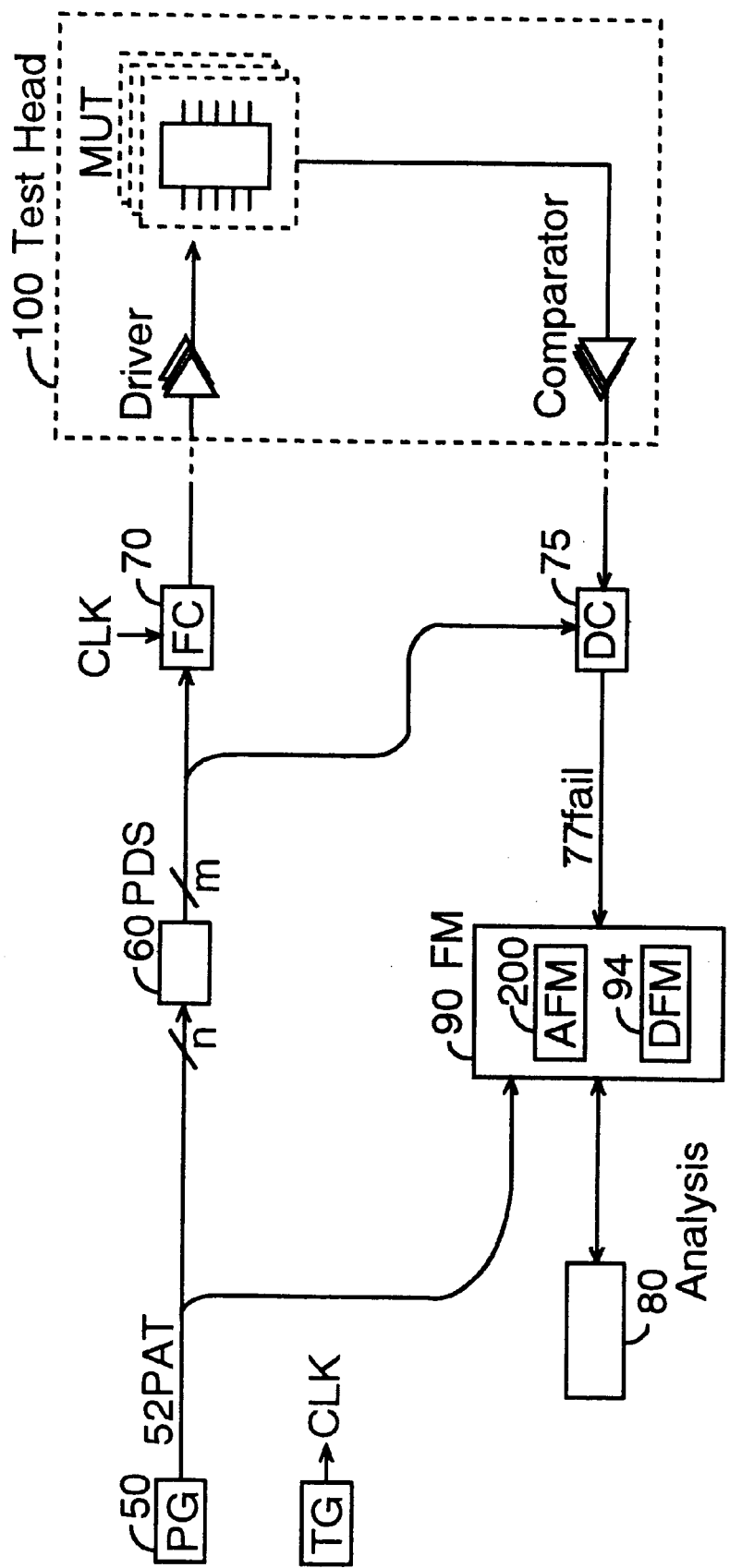
FIG. 4 shows an example of structure in a memory test system.
Figure 5:
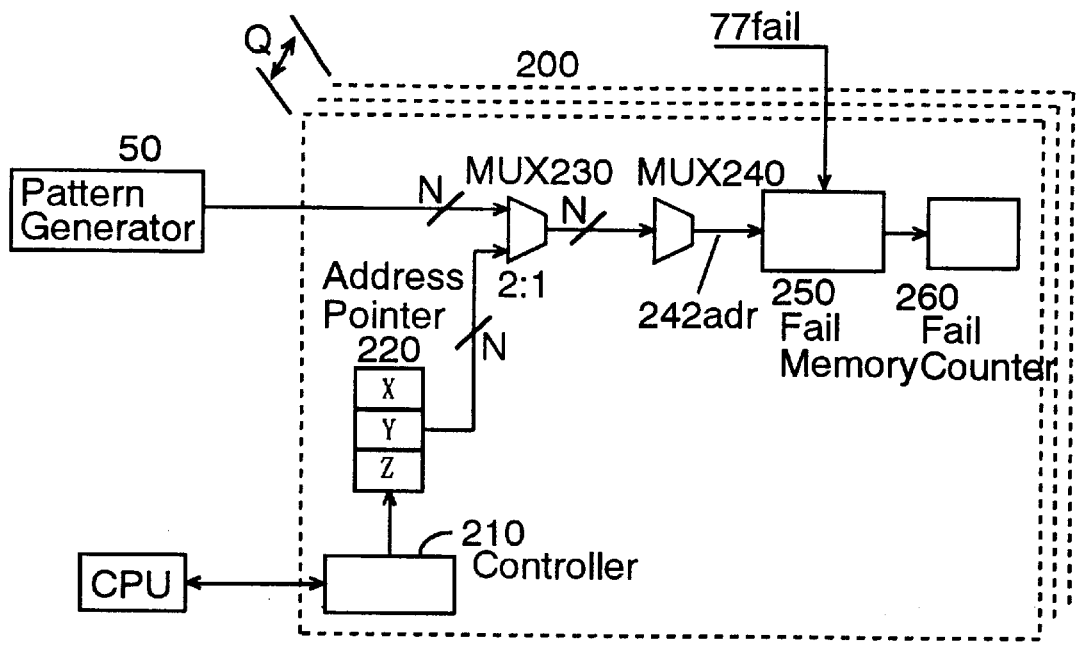
FIG. 5 is a block diagram showing an example of structure in a conventional AFM (address fail memory) 200 for counting the number of overall fail bits of an MUT (memory under test).

FIG. 2 shows a structure of the fail counter 360 for corresponding to one channel of the memory test system. The fail counter 360 is formed of an encoder 362, an accumulator 364 and a count register 366.

The encoder 362, in receiving the 4 bit data from the fail memory block 358, converts the number of "1" data to binary code data consisting of 3 bit (for indicating 0–4). The logic data conversion table in the encoder 362 is shown in FIG. 3.

The accumulator 364 accumulates the encoded data from the encoder 362 and the data from the count register 366 and outputs the resultant data which is latched in the count register 366. The count register 366 is a latch register which is able to express and hold at least the equal number of bits of the memory capacity. The count register 366 is cleared prior to the of the operation.

Under the fail counting process of the present invention, the address generation sequence is reduced to ¼, and thus the time required for counting the fail bits is also reduced to ¼ of the conventional technology.

In the foregoing embodiment, the present invention is explained by the example in which the fail analysis memory is divided into 4 memory blocks. However, the fail analysis memory may be divided into arbitrary number of memory blocks M (for example, 16, 32 or 64) while accompanying an encoder, an accumulator and a count register having corresponding structures to meet the number of memory blocks and accomplish the effects of the present invention.

Since it is configured as described in the foregoing, the present invention has the following effects.

The fail memory block 358 is provided in which the fail memory is divided into M memory blocks to read the data therefrom at the same time. During the measurement of the MUT, the fail memory block 358 is treated as a single memory and the data is written therein. During the fail analysis, the memories of all of the M memory blocks are set to the enable state so that the M memory data is read out in parallel at the same time. The read out data is converted to the binary code data by an encoder and accumulated to count the number of fails. As a result, the address generation process and the time for counting the fails are reduced to 1/M of the conventional technology.

What is claimed is:

1. A fail analysis device for a semiconductor memory test system to evaluate performance of an MUT (memory under test), comprising:

a pattern generator for generating a test pattern signal including MUT address data to be supplied to said MUT in a fail data acquisition process;

a fail memory for storing fail data of said MUT as a single memory in said fail data acquisition process, said fail memory being formed with a plurality of memory blocks which are accessed in parallel at the same time in a fail data analysis process;

an address pointer for generating fail memory address data in said fail data analysis process;

a multiplexer for applying said MUT address data to said fail memory in said fail data acquisition process and applying said fail memory address data to said fail memory in said fail data analysis process;

enable signal providing means for providing an enable signal to only one of said plurality of memory blocks of said fail memory in said fail data acquisition process and providing an enable signal to all of said plurality of memory blocks in said fail data analysis process; and a fail counter for counting the number of fail data in said fail memory when receiving said fail data from said plurality of memory blocks in parallel, said fail counter including an encoder for converting the total number of said memory blocks having said fail data therein to a binary code representing said total number.

2. A fail analysis device for a semiconductor memory test system as defined in claim 1, wherein said fail counter further including an accumulator which adds said binary code from said encoder to data from a count register which latches added results until the next count cycle of said fail counter.

3. A fail analysis device for a semiconductor memory test system as defined in claim 1, wherein said encoder in said fail counter is a data table for converting the total number of said memory blocks in said fail memory having said fail data therein to a binary code representing said total number.

4. A fail analysis device for a semiconductor memory test system as defined in claim 1, wherein said enable signal providing means includes a decoder for decoding higher bits of address data generated for said fail analysis process to produce said enabling signal and a plurality of gate circuits for selectively providing said enable signal to one of said memory blocks through one of said gate circuits in said fail data acquisition process while providing said enable signal to all of said memory blocks through all of said gate circuits in said fail analysis process.

* * * * *